United States Patent
Cima

(10) Patent No.: US 11,835,571 B2
(45) Date of Patent: Dec. 5, 2023

(54) DEVICE FOR DETECTING A FAULT IN AN ELECTRICAL NETWORK, ELECTRICAL NETWORK OR EQUIPMENT COMPRISING SUCH A DEVICE AND METHOD FOR DETECTING A FAULT

(71) Applicants: SAFRAN ELECTRICAL & POWER, Blagnac (FR); Lionel Cima, Saint Cyr sur Loire (FR)

(72) Inventor: Lionel Cima, Saint Cyr sur Loire (FR)

(73) Assignees: SAFRAN ELECTRICAL & POWER, Blagnac (FR); Lionel Cima, Saint Cyr sur Loire (FR)

( * ) Notice: Subject to any disclaimer, the term of this patent is extended or adjusted under 35 U.S.C. 154(b) by 0 days.

(21) Appl. No.: 17/757,860

(22) PCT Filed: Dec. 22, 2020

(86) PCT No.: PCT/FR2020/052600
§ 371 (c)(1),
(2) Date: Jun. 22, 2022

(87) PCT Pub. No.: WO2021/130447
PCT Pub. Date: Jul. 1, 2021

(65) Prior Publication Data
US 2023/0032870 A1    Feb. 2, 2023

(30) Foreign Application Priority Data

Dec. 24, 2019  (FR) ........................................ 1915522
Dec. 24, 2019  (FR) ........................................ 1915523

(51) Int. Cl.
*G01R 31/08*    (2020.01)
*G01R 15/18*    (2006.01)
(Continued)

(52) U.S. Cl.
CPC ........... *G01R 31/086* (2013.01); *G01R 15/16* (2013.01); *G01R 15/181* (2013.01);
(Continued)

(58) Field of Classification Search
CPC .... G01R 31/086; G01R 15/16; G01R 15/181; G01R 31/1272; G01R 15/04; G01R 15/06;
(Continued)

(56) References Cited

U.S. PATENT DOCUMENTS

| | | | |
|---|---|---|---|
| 4,763,068 A | 8/1988 | Schmitt et al. | |
| 10,078,105 B2 | 9/2018 | Schneider et al. | |
| 2012/0123708 A1* | 5/2012 | Dong | H02H 3/042 |
| | | | 702/58 |

FOREIGN PATENT DOCUMENTS

| | | | |
|---|---|---|---|
| DE | 2122917 A | 11/1972 | |
| DE | 10056988 A1 | 5/2002 | |

(Continued)

OTHER PUBLICATIONS

International Preliminary Report on Patentability (Chapter II) received for PCT Patent Application No. PCT/FR2020/052602, dated Apr. 12, 2022, 21 pages (7 pages of English Translation and 14 pages of Original Document).

(Continued)

*Primary Examiner* — Farhana A Hoque
(74) *Attorney, Agent, or Firm* — WOMBLE BOND DICKINSON (US) LLP

(57) ABSTRACT

The invention relates to a device (D) for detecting a fault in an electrical network (1), comprising at least one electrical equipment (E) which is electrically connected to a first power conductor (C1) and to a second power conductor (C2), the electrical network (1) being provided with a common conductor (Cc). The device comprises a first mea- (Continued)

suring member (O1) of the common mode voltage present on the power conductors (C1, C2) and a second measuring member (O2) of a current flowing in the power conductors (C1, C2). The device also comprises a calculator (UP) configured to determine over a determined observation period a mixed energy ($E_{mix}$) transported in the measurement region from the first variable ($V_{res}$) and the second variable ($I_{net}$). The invention also relates to an equipment, a localization system and a method for detecting a fault in an electrical network.

20 Claims, 6 Drawing Sheets

(51) Int. Cl.
  *H02H 1/00* (2006.01)
  *H02H 7/20* (2006.01)
  *G01R 15/16* (2006.01)
  *G01R 31/12* (2020.01)
(52) U.S. Cl.
  CPC ....... *G01R 31/1272* (2013.01); *H02H 1/0007* (2013.01); *H02H 1/0015* (2013.01); *H02H 7/20* (2013.01)
(58) Field of Classification Search
  CPC ...... H02H 1/0007; H02H 1/0015; H02H 7/20; H02H 3/42

USPC ......................................................... 324/522
See application file for complete search history.

(56) References Cited

FOREIGN PATENT DOCUMENTS

| EP | 1437600 A1 | 7/2004 |
| EP | 2720333 A2 | 4/2014 |
| FR | 2976083 A1 | 12/2012 |
| GB | 0300957 A | 1/1930 |
| GB | 2007048 A | 5/1979 |
| WO | 2011/029464 A1 | 3/2011 |

OTHER PUBLICATIONS

International Search Report and Written Opinion received for PCT Patent Application No. PCT/FR2020/052600, dated Apr. 23, 2021, 21 pages (10 pages of English Translation and 11 pages of Original Document).
International Search Report and Written Opinion received for PCT Patent Application No. PCT/FR2020/052601, dated May 10, 2021, 17 pages (8 pages of English Translation and 9 pages of Original Document).
International Search Report received for PCT Patent Application No. PCT/FR2020/052602, dated May 3, 2021, 7 pages (3 pages of English Translation and 4 pages of Original Document).

* cited by examiner

[Fig. 1a]
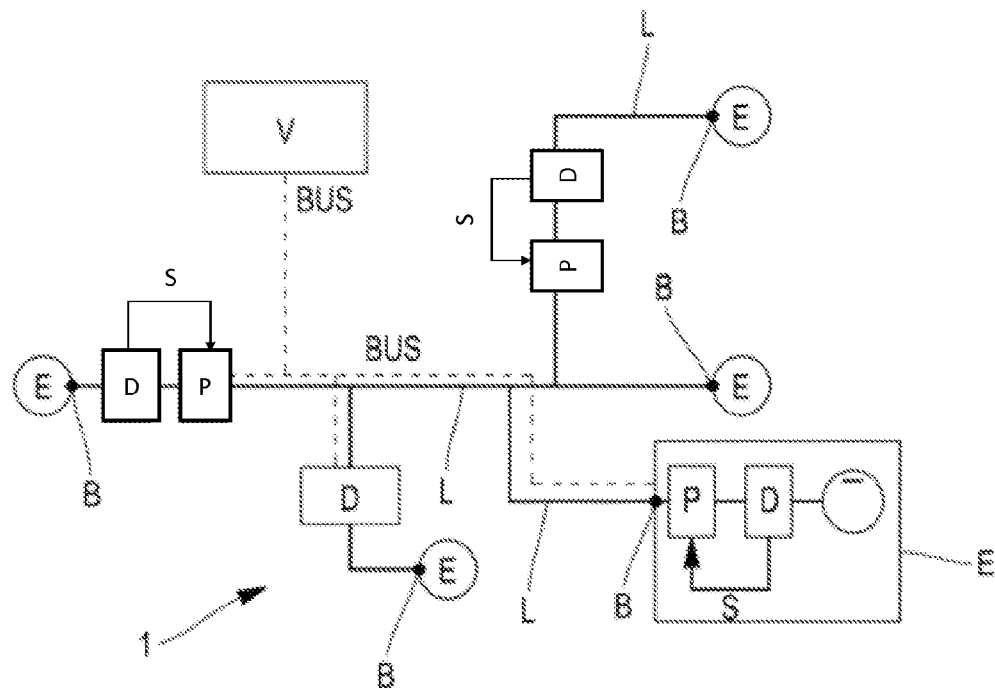
[Fig. 1b]
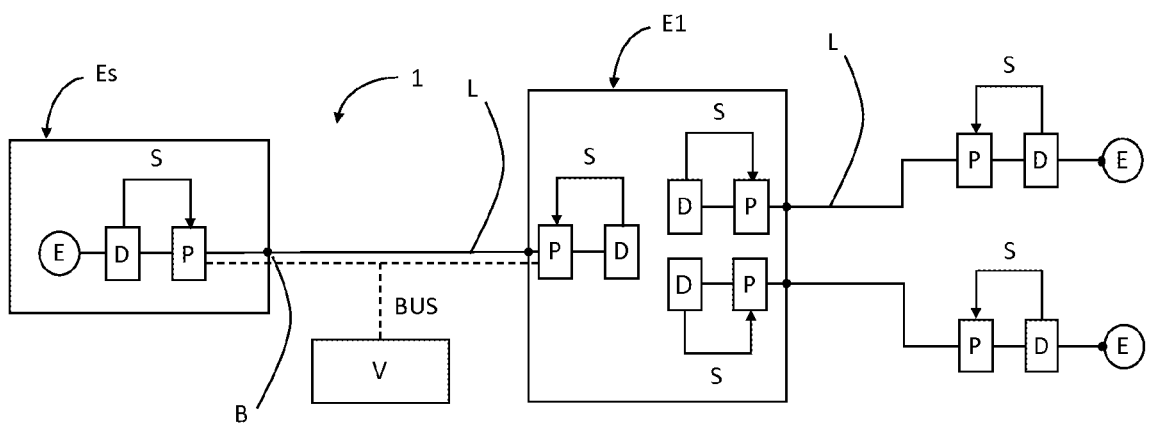

[Fig. 2]
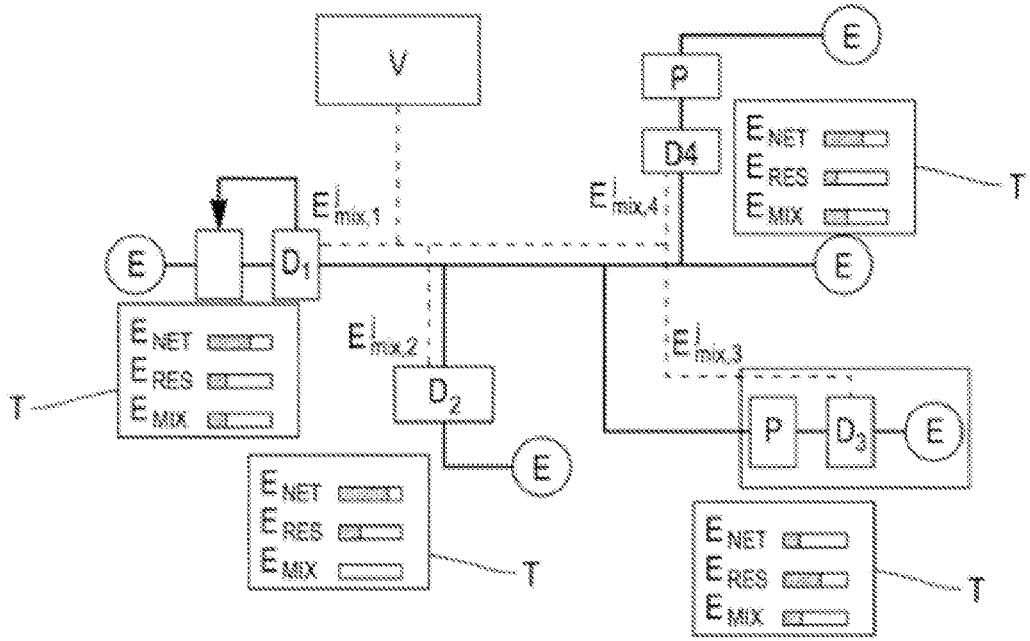
[Fig. 3]
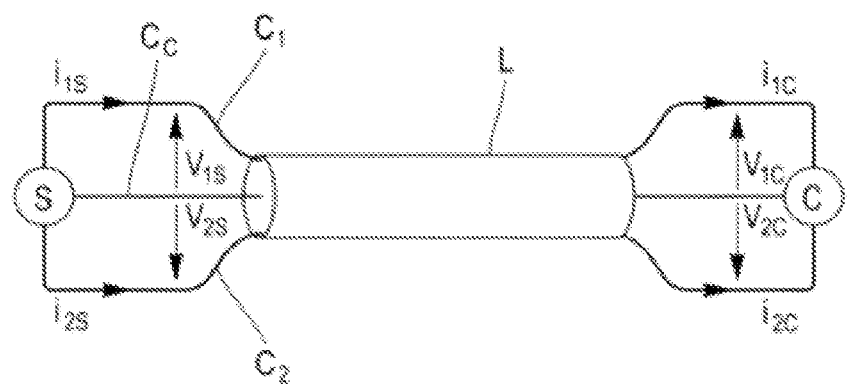
[Fig. 4a]
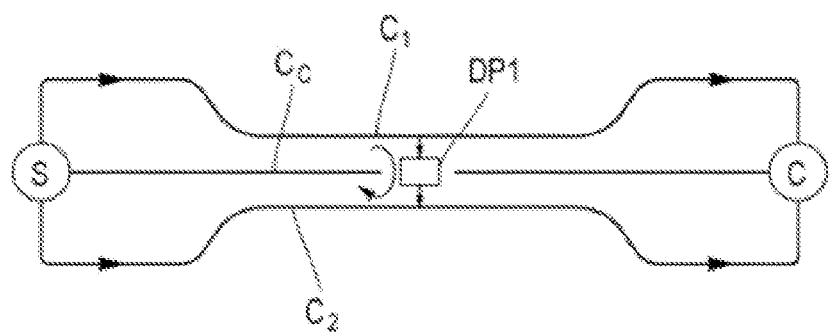

[Fig. 4b]
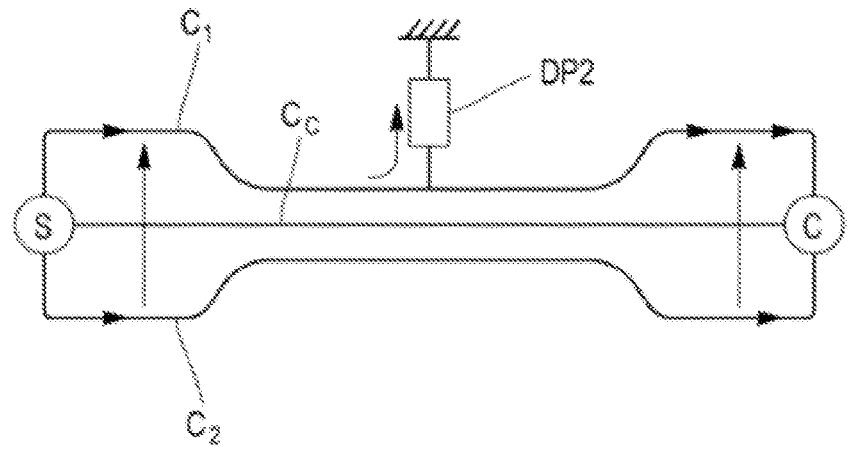
[Fig. 4c]
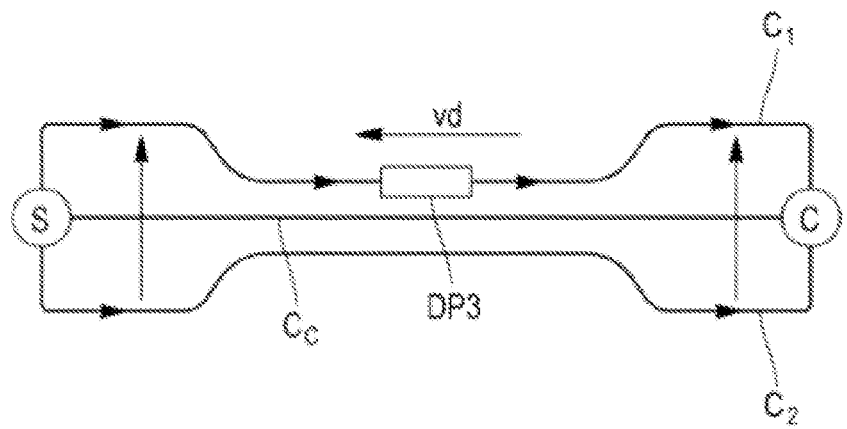
[Fig. 5]
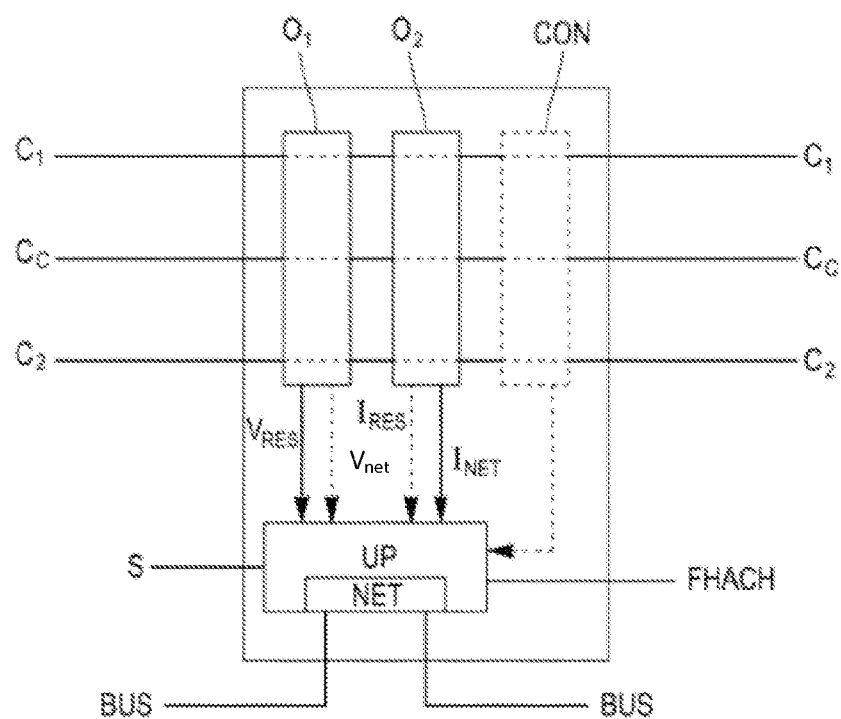

[Fig. 6]
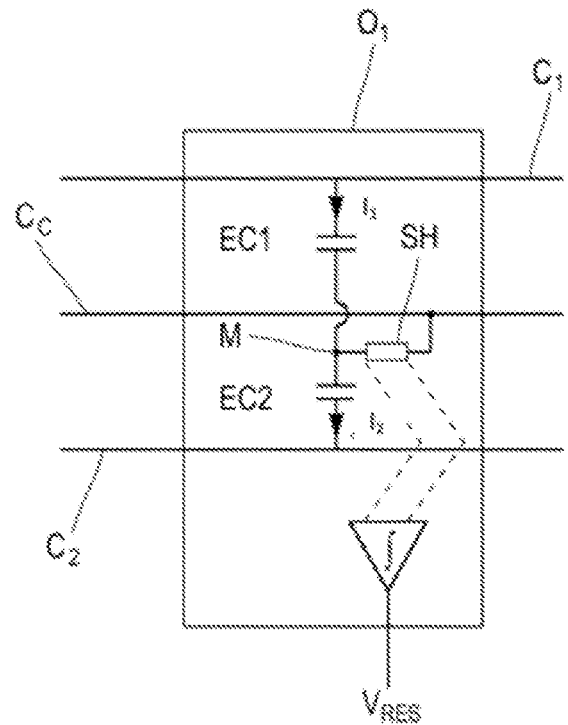
[Fig. 7]
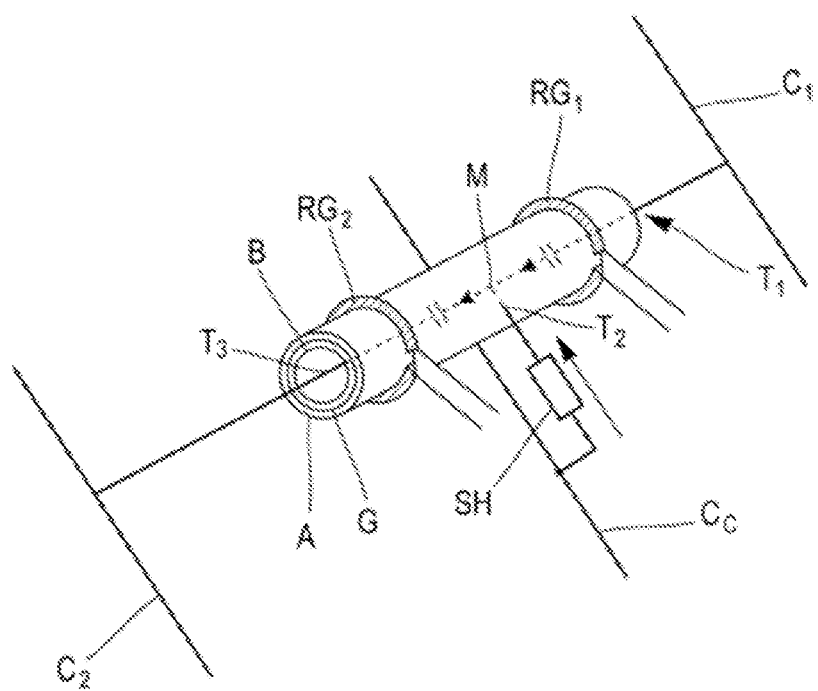

[Fig.8a]
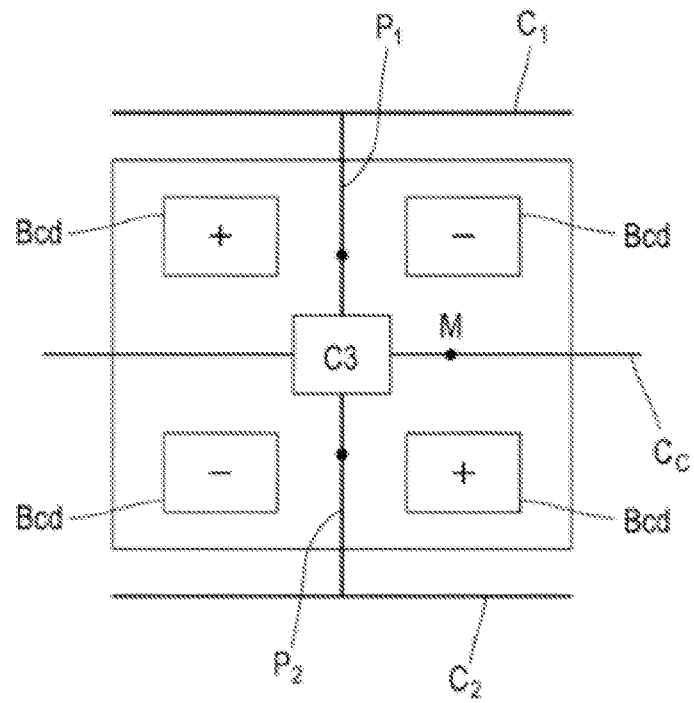
[Fig.8b]
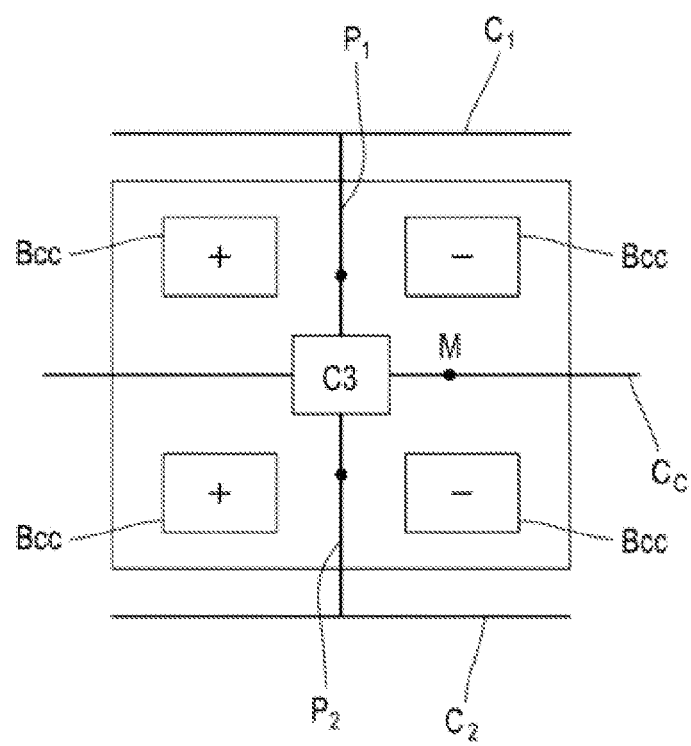

[Fig.9]
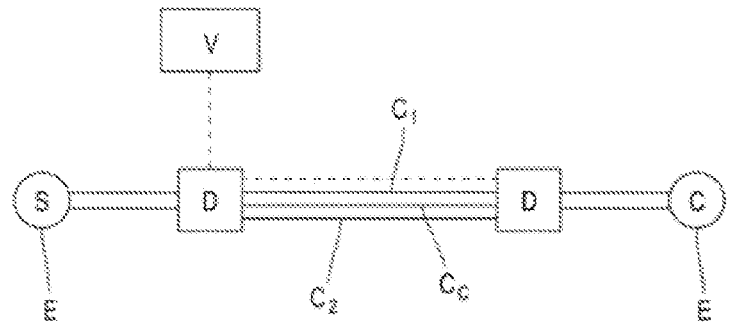
[Fig.10]
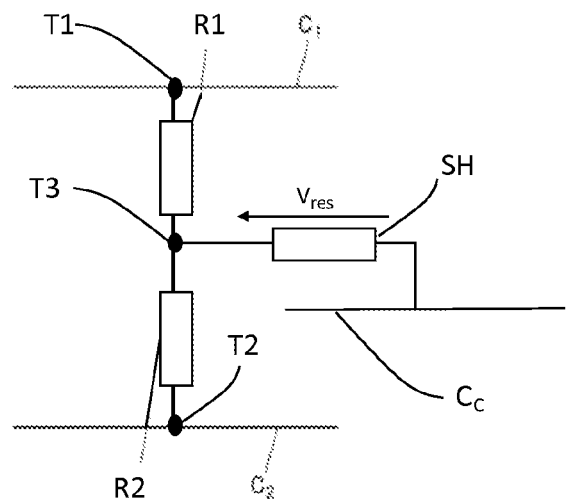
[Fig.11]
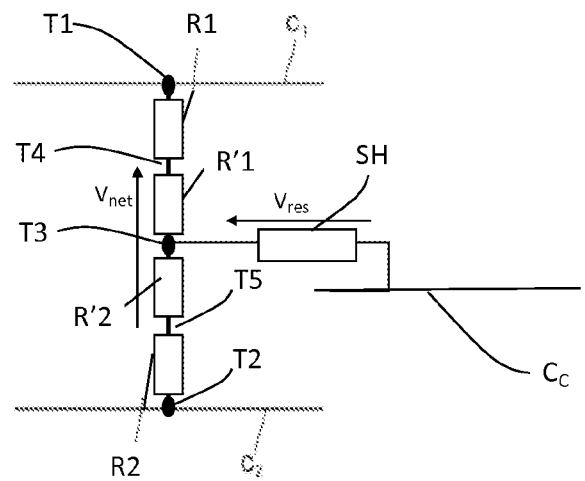

DEVICE FOR DETECTING A FAULT IN AN ELECTRICAL NETWORK, ELECTRICAL NETWORK OR EQUIPMENT COMPRISING SUCH A DEVICE AND METHOD FOR DETECTING A FAULT

TECHNICAL FIELD OF THE INVENTION

The present invention relates to a device and a method for detecting a fault in an electrical energy distribution network. It also concerns an electrical energy distribution network or an equipment equipped with such a detection device.

TECHNICAL BACKGROUND OF THE INVENTION

The needs to reduce the carbon footprint of the human activity, as well as the need to optimize the energy efficiency, leads to the use of the electrical energy. This job requires to convey the electrical energy, in a direct (DC) or alternating (AC) form, between one or more sources (a battery, a generator, photovoltaic panels for example) and one or more loads (electric motors, inverters, etc.) by means of distribution lines, protection systems (circuit breaker, disconnecting switch, and other breaking members). The set of sources, loads, lines and protection systems constitutes the electrical network.

The network is sometimes required to convey large amounts of power that can exceed several tens of kilowatts, even hundreds of kilowatts, or even megawatts. It can be embarked in a vehicle such as a land vehicle (car or tank) or railroad, a surface ship or a submarine or an aircraft for example. It is therefore likely to operate in a severe environment, i.e. one that can present large amplitudes of temperature, pressure, vibration, electromagnetic fields or humidity. A fault of the network in these applications can have serious consequences, so it is imperative to secure it.

More generally, and independently of the field of application, it is important to be able to detect, and advantageously to localize, a fault occurring in an electrical network. A network is usually protected by means of protection devices, with the detection of a fault leading to the switching of these devices to electrically isolate at least a portion of the network. These can be, for example, circuit breakers, contactors, solid state switches, fuses or current limiters that switch on when excessive currents occur. The localization of a fault allows only the faulty section of the network to be isolated, and this functionality is advantageous in that it allows a minimum operation level of the network to be maintained as well as a targeted intervention by a maintenance team.

The faults that can occur in an electrical network are of various natures: insulation defects, losses by excessive switching at the level of a load, excessive energy consumption, short-circuit, etc. It can also be the formation of an electric arc in, or between, the conductors that make up the distribution lines and the electrical apparatus. An electric arc corresponds to an unintentional discharge propagating in a gas (air) between two conductive segments of the network. When such a discharge occurs in an electrical insulator encasing a conductor without completely damaging it, it is referred to as "partial discharge". These electrical discharges can be caused by many things, such as improper connection of the conductors, the degradation of the electrical insulator surrounding these conductors, the presence of foreign objects or the poor quality of an insulator. They are frequent phenomena in the networks and are likely to cause fires, explosions, phenomenal local temperature rises of over 10,000° C., high overpressures and the emission of significant ultraviolet radiation. The appearance of these electrical arcs is favoured by humidity, depression and temperature of the environment so that their early detection is particularly essential when the network operates in a severe environment as mentioned above.

The electrical arcs are usually not detected early enough by the usual protection devices, such as circuit breaker, which are triggered on the basis of an excessive current or power consumption. Some electrical arcs develop over very long periods of time, without causing the appearance of overcurrent or overpower in the network that would allow their early detection by the usual means. This is in particular the case for "series" arcs that can develop in a power conductor or in a connector. The power dissipated during the start-up of a series arc is much lower than that of a parallel arc or the nominal power of the network.

The detection of the electrical arcs in a network is generally carried out by monitoring the temporal and/or frequency evolution of the signals of the network (current and/or voltage), knowing that the occurrence of such a phenomenon leads to the formation of signals with a strong spectral content, even in the case of a direct network. An example of such a detection solution is in particular presented in the document U.S. Pat. No. 10,078,105. However, these methods based on the temporal or spectral analysis of the signals, current and/or voltage, are particularly difficult to implement and lead to many false positives, which can be caused by the loads or the active sources (i.e. switched) present on the network. In particular, they are not efficient in detecting the occurrence of a series electrical arc in a direct network (DC).

OBJECT OF THE INVENTION

An aim of the invention is to remedy the aforementioned disadvantages. One aim of the invention is in particular to propose a device and a method for detecting faults in an electrical network which are particularly reliable and which are adapted to detect the occurrence, and advantageously to localize, a wide variety of faults, including electrical arcs and in particular series arcs, in particular in a direct network.

BRIEF DESCRIPTION OF THE INVENTION

In order to achieve this goal, the object of the invention proposes a device for detecting a fault, in particular series arcs, in an electrical network, in particular DC, comprising at least one electrical equipment electrically connected to a first power conductor, a second power conductor.

According to the invention, the electrical network is equipped with a common conductor. The device is intended to be connected to the power conductors of the network and to the common conductor at the level of a measurement area, and it comprises:

- a first measuring member allowing to elaborate a first quantity representative of the common mode voltage present on the power conductors;
- a second measuring member allowing to elaborate a second quantity representative of a network current flowing in the power conductors;
- a calculator, connected to the first and the second measuring members, the calculator being configured to determine, over a determined observation period, a quantity representative of an energy referred to as "mixed energy" defined as the integral over the determined observation period of the product of the common mode voltage and the network current and which transits in the measurement area, the quantity representative of the mixed energy being determined from the first quantity and from the second quantity.

According to other advantageous and non-limiting characteristics of the invention, taken alone or in any technically feasible combination:
- the calculator is also configured to exploit the quantity representative of the determined mixed energy and to generate a signal indicating the fault of the network;
- the first and the second measuring members are configured to elaborate, respectively, the first quantity representative of the direct component of the common mode voltage and the second quantity representative of the direct component of the network current;
- the first measuring member also allows to elaborate a third quantity representative of the differential mode voltage present between the two power conductors, and the calculator is also configured to determine, over the determined observation period, a quantity representative of a network energy which transits in the measurement area, from the third quantity and from the second quantity;
- the second measuring member also allows to elaborate a fourth quantity representative of a common mode current flowing in the two power conductors, and the calculator is also configured to determine, over the determined observation period, a quantity representative of a residual energy which transits in the measurement area from the fourth quantity and the first quantity;
- the detection device also comprises a network controller for interfacing the calculator with a communication bus;
- The communication bus (BUS) is the common conductor (Cc), and the network controller (NET) is connected to the common conductor (Cc).

The invention also proposes an electrical equipment, such as an electrical source or load, comprising a detection device as previously described.

According to another aspect, the invention proposes a system for localizing a fault in an electrical network comprising at least one first power conductor and a second power conductor. According to the invention, the localizing system comprises:
- a common conductor;
- two detection devices as described above connected at the level of respective measurement areas to the power conductors and to the common conductor;
- a supervision device connected by a communication bus to the two detection devices, the supervision device comprising a calculation member configured to exploit the information supplied by the detection devices on the communication bus in order to localize a fault occurring in the electrical network in the section of the conductors comprised between the two detection devices.

According to yet another aspect, the invention proposes an electrical network, direct or alternating, comprising at least two electrical equipment connected by at least one first power conductor, a second power conductor, the electrical network being equipped with:
- a common conductor;
- a plurality of detection devices as described above connected at the level of respective measurement areas to the power conductors and to the common conductor;
- a supervision device connected by the communication bus to the detection devices.

According to other advantageous and non-limiting characteristics of this aspect of the invention, taken alone or in any technically feasible combination:
- the geometries of the power conductors are identical;
- at least one of the electrical equipment is a source, and the common conductor is connected to a midpoint of the source;
- the power conductors and the common conductor are assembled together in parallel to form a single cable or a harness.

According to a further aspect, the object of the invention proposes a method for detecting a fault, especially the series arcs, in an electrical network comprising at least one electrical equipment electrically connected to two power conductors, the electrical network being equipped with a common conductor. The detection method comprises the following steps:
- determining at the level of a measurement area a first quantity (representative of the common mode voltage of the power conductors);
- determining at the level of the measurement area a second quantity representative of a network current flowing in the power conductors of the network;
- exploiting the first quantity and the second quantity to detect the occurrence of a series arc in the electrical network.

According to other advantageous and non-limiting characteristics of this aspect of the invention, taken alone or in any technically feasible combination:
- the detection method also comprises a step aimed at determining, over a determined observation period, a quantity representative of an energy referred to as "mixed energy" defined as the integral over the determined observation period of the product of the common mode voltage and of the network current, and transiting in the measurement area, the mixed energy being determined from the product of the first quantity and of the second quantity;
- The detection method also comprises a step aiming to process the quantity representative of the mixed energy determined over distinct observation periods, in particular for determining the variation of this mixed energy;
- The detection method comprises the determination, over a determined observation period, of quantities representative of the mixed energies transiting in a plurality of measurement areas and the exploitation of the determined mixed energies in order to localize the occurrence of the series arc in the electrical network, in particular by calculating the mixed energy differences.

The invention finally proposes, according to another aspect, a method for deploying a system for detecting a fault, especially series arcs, in an electrical network comprising at least one first power conductor and a second power conductor. The method comprises the following steps:
- equipping the electrical network with a common conductor (Cc);
- electrically connecting at least one detection device as described above to the power conductors and to the common conductor.

BRIEF DESCRIPTION OF THE FIGURES

Further characteristics and advantages of the invention will be apparent from the following detailed description of the invention with reference to the attached figures, in which:

FIGS. 1a and 1b show examples of an electrical network according to one embodiment of the invention;

FIG. 2 represents the state of the network at a time of an observation period j established by a supervision device;

FIG. 3 illustrates a section of an electrical network according to the invention;

FIGS. 4a, 4b and 4c show respectively a network section during the occurrence of a parallel type, insulation defect type and series type fault;

FIG. 5 shows a detection device according to one embodiment of the invention.

FIG. 6 represents a schematic circuit forming another embodiment of a first measuring member of a detection device.

FIG. 7 represents an example of the embodiment of a first measuring member of a detection device;

FIGS. 8a and 8b represent another example of the embodiment of a first measuring member of a detection device;

FIG. 9 represent a system for detecting and localizing a fault in accordance with the invention.

FIGS. 10 and 11 show preferred embodiment examples of a sensor for a measuring member compatible with a detection device of the invention.

DETAILED DESCRIPTION OF THE INVENTION

For the sake of simplicity of writing, we will assimilate in the present description a quantity (an energy, a voltage, a current for example) with the measurement of this quantity (the quantity representing the measured or estimated energy, voltage or current).

Electrical Network

FIGS. 1a and 1b show two examples of an electrical network 1 whose proper operation is to be monitored, by detecting the occurrence of its faults and, advantageously, by localizing them. These faults, as presented in the introduction of this application, can be of very diverse natures, a series or parallel electric arc, an overconsumption, a short-circuit or any other insulation defect.

In a conventional way, this electrical network 1 comprises at least two power conductors that allow the required power to be transited. The electrical network 1 can be a direct network (DC), and it will then be considered that it has a network frequency between zero and 5 Hz to keep all its generality to the present description. This can be a fixed-frequency conventional single-phase alternating network with a network frequency of 50 Hz or 60 Hz or 400 Hz plus or minus 5 Hz, or a variable-frequency alternating network, typically between 360 and 800 Hz. But more generally, the electrical network 1 can operate in any suitable frequency range. The present invention is also applicable to the multiphase networks, such as a three-phase network for example.

The invention is particularly applicable when the electrical network 1 is aimed to convey a relatively large amounts of power between the various electrical equipment, sources or loads, which make it up. Preferably, therefore, the voltages and currents developing on the electrical network 1 have values typically higher than, respectively, 50V, 330V, 600V, 1000V, 3000V or 10000V and 100 A. But nothing excludes the application of the principles of the invention to electrical networks conveying relatively smaller powers.

As can be seen in FIG. 1, the electrical network 1 comprises a plurality of electrical equipment E (and more generally, at least one electrical equipment E), sources or loads, and conductive lines L connecting some of the equipment E to each other, here in the form of a meshed network, so as to electrically feed the loads with the energy supplied by the sources. The electrical equipment E are connected to the lines L by means of connection terminals B. The protection members, such as circuit breaker, disconnectors or any other breaking member, are part of the network 1 and its electrical equipment E even if they are not shown in the figures.

The electrical equipment E can be of any kind that is suitable for the field of application of the network. Some of these equipment E can alternatively form a source and a load (generator/motor). It can be a power distribution equipment. The equipment can be active, such as an inverter, or passive. The electrical equipment E, when they form sources, can be for example batteries or generators or photovoltaic panels or wind turbines, etc. There can be a combination of several sources and several loads in the same network. In FIG. 1b, we have represented a distribution equipment E1 arranged at the level of a node of the network between a source Es, and two loads arranged at the end of lines L.

In order to allow the protection of the network 1, it is equipped with a common conductor (which will be described in more detail in a later section of this description) and it contains at least one detection device D and advantageously a plurality of such devices D distributed in the network 1 at the level of a plurality of measurement areas. A detection device D has connection terminals allowing to connect it to the conductors of the lines L or of the equipment E, in order to place it effectively in the network. Preferably, the detection device D is non-intrusive, i.e. it is connected in parallel to the power conductors of the lines L and to the equipment E forming the network 1 (for example for the voltage measurements), or it implements non-intrusive sensors (for example of the air coil, Hall effect or Neel Effect® type for the current measurement). This reduces the number of interconnections on the conductors and thus the risk of arc-type faults.

The invention provides for a distinction to be made in all the energy conveyed by the network, and therefore at the level of each measurement area, between an energy referred to as "energy of network", an energy referred to as "residual energy" and an energy referred to as "mixed energy". The network energy corresponds to the energy conveyed in a measurement area when the network is perfectly balanced and in the absence of any fault. The residual energy and the mixed energy reflect an imbalance in the electrical network 1 that occurs and is caused by the occurrence of a network fault. However, the residual and mixed energies are not completely zero in a healthy network, due to certain natural imbalances. For this reason, according to some embodiments of the invention, it is foreseen to measure point-to-point differences or differences in distinct instants between energies in order to detect, and also to localize, certain faults without generating false-positives linked to natural imbalances.

As will be detailed in a later portion of this description, a detection device D in accordance with an embodiment of the invention is adapted to measure the network energy $E_{net}$, the residual energy $E_{res}$ and the mixed energy $E_{mix}$, transiting at the level of the measurement area of the network 1 in which it is localized, and during successive observation periods. The measurement of these energies allows to detect and sometimes to localize the occurrence of a fault in the network 1 or in a section of the network 1. At least, such a detection device D is adapted to measure a mixed energy $E_{mix}$ so as to allow the detection of a series arc. For the sake of clarity, we specify that by "localizing a fault", we mean the ability to identify the section of the electrical network 1 or to identify the equipment E in which the fault has occurred. This section can be defined by the portion of the network comprised between two detection devices D, or by a source type equipment E arranged upstream of a device D, or by a load type equipment E arranged downstream of a detection device D.

The electrical network 1 may also comprise a protection device P, or a plurality of such devices P, allowing to isolate a section of the network 1, such as a line L or an electrical equipment E. These may be conventional circuit breakers for example. In general, such devices P are placed either at the level of a source, at the level of a load, or, most often, at the level of the nodes of the network via distribution equipment E1, as shown in FIG. 1b.

The detection devices D and the protection devices P can be distributed very freely in the network 1, according to its nature and its topology, in order to ensure its protection. These devices D, P can be placed one and/or the other at the end of a line L, on a section of line L or integrated in an electrical equipment E. A detection D and protection P device are not necessarily associated with each other, although it can be advantageous in some cases to associate them, for example in the same case, so as to realize a single module allowing to implement the two functions of detection and protection. In this case, a detection terminal of the detection device D, over which a detection signal S is generated when a fault is detected, can be connected to a trigger terminal of the protection device P.

Some sections of the network 1, lines L or equipment E, may not be equipped with detection devices D and/or protection devices P. In this case, it may not be possible to detect or localize the occurrence of a fault in this section of network 1 and/or to disconnect this section of the network 1. However, it may be possible to detect the occurrence of the fault from a detection device D arranged outside the occurrence section of the fault and to protect the network 1 as a whole, for example by disconnecting it from the equipment E forming the energy sources. To do this, and as will be presented in detail in the rest of this presentation, we can measure energy variations directly at the output of a source or directly at the input of a load. When a detection device D is placed at the source output, respectively load input, it is preferable to place it as far upstream as possible, and respectively as far downstream as possible, so that defects can also be detected in the protection devices P or the connection terminals B.

As will become apparent in the rest of this description, some categories of faults are detectable locally, in a measurement area, from the sole measurements of the network energies Enet, residual Eres and/or mixed Emix carried out in this area. This is in particular the case for a series arc, an insulation defect or an overconsumption. The detection device D is then adapted to generate an electrical signal S, on a detection terminal of this device D, indicating the occurrence of a fault of the network 1. When the detection device D is locally associated with a protection device P, this signal S can be locally exploited by the protection device P to immediately isolate the section of the faulty network, line L or equipment E, from the rest of the network 1.

To detect other categories of faults, such as the occurrence of an electric arc between two parallel conductors, to localize faults in the network 1 more precisely, or to qualify a fault in terms of energy consumed, it may sometimes be necessary to exploit the energy measurements $E_{net}$, $E_{res}$, $E_{mix}$ supplied by a plurality of detection devices D. To this end, and according to a particular embodiment of the invention, it is provided to associate with the electrical network 1 a supervision device V. This device V, typically implemented by a digital calculation member, is connected to at least some of the detection devices D of the network 1 by means of a communication bus BUS, represented in dotted line on FIG. 1. Any type of bus can be suitable for implementing the communication bus BUS, including in particular a serial bus or a parallel bus operating under any possible form of protocol, whether it meets an established standard or not. It should be noted that the supervision device V can be integrated into one of the detection devices D. In this case, it can be provided that these devices D comprise a calculation member making them adapted to implement the supervision processing, at least one of these devices being then activated to operate as the supervision device V of the network 1.

In a configuration in which the network is equipped with a plurality of detection devices D coupled to a supervision device V, these devices are configured to place on the communication bus BUS data indicating the occurrence of a fault and/or data representative of the energies $E_{net}$, $E_{res}$, $E_{mix}$ which they measure over a given observation period. The detection devices D are identified, on the computer network formed by the communication bus BUS, by means of a unique identifier. The communication bus BUS comprises a clock information distributed to the various detection devices D so that they share a common time base. The data $E^j_{net,i}$, $E^j_{res,i}$, $E^j_{mix,i}$ representative of the energies measured by an identifier device i and placed on the communication bus BUS during a determined observation period j can thus be ordered and processed by the supervision device V to determine the state of the network at a given moment, i.e. the network, residual, mixed energies that transit in each measurement area during a given observation period.

FIG. 2 shows the state of the network 1 of FIG. 1 at an instant of an observation period j as it can be established by the supervision device V. Each detector of the network D1, D2, D3, D4 is identified here by an index corresponding in a simplified way to its identifier on the computer network. Each detector places its mixed energy measurement $E^j_{mix,i}$ (and its other measurements $E^j_{net,i}$, $E^j_{res,i}$ not shown on FIG. 2) on the communication bus BUS, which allows the supervision device V to inform a data structure of the state of the network, symbolized on this FIG. 2 by tables T of the energy levels which transit in each measurement area. This data structure can record, in a table indexed by the observation period j, the network, residual and mixed energies of each measurement area. Detection devices D (not shown in FIG. 2) can advantageously be placed at the level of distribution "nodes", for example in distribution equipment of the network 1, as shown in FIG. 1b.

The supervision device V is configured to exploit the data supplied by the detection devices D of the network 1 and delivered by the communication bus BUS. The purpose of this exploitation is to detect a fault of the network and/or to localize this fault in the network 1 and/or to qualify, in terms of energy, a detected fault.

The supervision device V can emit a signal indicating the fault of the network 1 and this signal can be exploited to disconnect a section of the network. For this purpose, the supervision device V can be connected to at least some of the protection devices P of the electrical network 1 in order to activate them, where appropriate. This can be a point-to-point connection or a connection implementing the communication bus BUS, or another dedicated bus, to which the protection devices P are then connected. In another embodiment, the supervision device, in particular when it is integrated in one of the detectors D of the network, can communicate with a third-party device responsible for controlling the protection devices P of the network.

It is thus understood that according to the embodiment of the invention represented in FIGS. 1a and 1b, there is an electrical network 1 and a plurality of detection devices D distributed on the network 1 at the level of measurement areas, these devices D communicating to a supervision device V of the data $E^j_{net,i}$, $E^j_{res,i}$, $E^j_{mix,i}$ representative of energies which transit in these measurement areas i during a determined observation time period j. The supervision device V can exploit this data to represent the state of the network, i.e. the energy that transits in each measurement area during successive observation periods.

An energy data, or a data representing a variation of energy higher than a certain threshold allows to detect a fault without necessarily being able to localize it (except at the level of the ends of the network where a variation of energy can allow to localize a defect). On the other hand, the analysis of the differences in energies that transit between two (or more) detection devices D allows not only to improve the quality of the detection, but also to localize a fault between these two detection devices (D). To this end, the supervision device V can be configured to exploit the information supplied by the detection devices D on the communication bus BUS to localize a fault occurring in the electrical network 1 in the section of the conductors C1, C2, Cc included between these two devices or in an equipment E of the network. A system for localizing a fault in the network is thus available, as shown in FIG. 9, by equipping it with at least two detection devices D.

The supervision device V is therefore adapted to detect and/or localize and/or quantify the occurrence of a fault on the electrical network 1 in order to protect it, for example by disconnecting the section of the network 1 in which the fault has been localized.

Common Conductor

In order to allow the distinction between the different forms of energy conveyed by the network 1 formed by the power conductors on which the energy transits, the invention provides for the network 1 to be equipped with a common conductor. This common conductor forms a reference voltage for all electrical equipment E in the network to which it is electrically connected. It can be a mechanical mass of the network, or a neutral, but it is not necessarily the case. The common conductor is not intended to carry an intense current, but it may be at a high potential relative to the mechanical mass. It can be a simple telecommunication cable, for example a cable constituting, at least partly, the communication bus BUS described above. Alternatively, it may be a conductor similar to those forming the power conductors. The common conductor can be connected to a midpoint connection terminal of the "source" or "load" type equipment E when these are symmetrical (e.g. two midpoint batteries or the midpoint of an inverter or the midpoint of photovoltaic panels). The common conductor can be connected to an existing midpoint of an equipment, source or load, or to a "manufactured" midpoint from a resistive divider on the source and/or load side. This dividing bridge allowing for connecting the common conductor can be integrated into a detection device D.

In the case of a bipolar configuration (single-phase alternating AC or direct DC network), a line L is therefore made up of a first and a second power conductor to which a common conductor is added. In the case of a three-phase configuration, a line L comprises a third power conductor and the common can be connected to the neutral. For the sake of simplicity, we will consider in the following that the network 1 is a bipolar network comprising two power conductors to which a common conductor is added, but the principles described apply generally to a network comprising any number of power conductors.

Definition of the Network, Residual and Mixed Energies

To illustrate the benefit of the common conductor in the scope of the detection of a fault in an electrical network, FIG. 3 shows, by way of illustration, a section of an electrical network comprising a line L arranged between a source S and a load C. The line L is made of a first power conductor C1, a second power conductor C2 and a common conductor Cc.

As can be seen from these figures, the currents $I_{1s}$, $I_{2s}$, $I_{1c}$, $I_{2c}$ are defined as the currents flowing respectively on the first and second power conductors C1, C2 on the side of the source S and of the load C. And we define in the same way the voltages $V_{1s}$, $V_{2s}$, $V_{1c}$, $V_{2c}$ the potential differences present between the common conductor Cc and, respectively, the first and second power conductor C1, C2 on the side of the source S and of the load C.

Note that the voltages and currents referred to in the rest of this description are by nature time-varying, i.e. they are expressed in the form V(t) and I(t). However, to simplify the writing, we will designate these variable currents and voltages as V and I.

With reference to FIG. 3, the network voltages on the side of the source and of the load $V_{net,s}$, $V_{net,c}$ as the differential mode voltages present between the two power conductors C1, C2: $V_{net,s}=V_{1s}-V_{2s}$ and $V_{net,c}=V_{1c}-V_{2c}$. Similarly, we define the network currents on the side of the source and of the load $I_{net,s}$, $I_{net,c}$ as the differential mode current flowing on the two power conductors C1, C2: $I_{net,s}=\frac{1}{2}*(I_{1s}-I_{2s})$ and $I_{net,c}=\frac{1}{2}*(I_{1c}-I_{2c})$. Naturally, the network energy $E_{net}$ over a determined observation period corresponds to the integral, over this period, of the product $I_{net}*V_{net}$. This network energy can be established on the side of the source $E_{net,s}$ and of the load $E_{net,c}$.

When the section of the network in FIG. 3 is in normal operation and perfectly balanced, the network voltages $V_{net,s}$, $V_{net,c}$ and the network currents $I_{net,s}$, $I_{net,c}$ on both sides of the line L are identical. The network energies on the side of the source $E_{net,s}$ and on the side of the load $E_{net,c}$ are therefore also identical to each other with the exception of the losses dissipated in the line.

The occurrence of a fault of the electrical network leads to its unbalancing, and this unbalance can be made material by measuring the residual voltages $V_{res,s}$, $V_{res,c}$ which are defined on the side of the source by the common mode voltage $V_{res,s}=\frac{1}{2}*(V_{1s}+V_{2s})$ and on the side of the load by the common mode voltage $V_{res,c}=\frac{1}{2}*(V_{1c}+V_{1c})$. Similarly, we can measure the residual currents $I_{res,s}$, $I_{res,c}$ which are defined on the side of the source by the common mode currents $I_{res,s}=I_{1s}+I_{2s}$ and on the side of the load side by $I_{res,c}=I_{1c}+I_{2c}$. Naturally, the residual energy $E_{res}$ over a determined observation period corresponds to the integral, over this period, of the product $I_{res}*V_{res}$. This residual energy can be established on the side of the source $E_{res,s}$ and of the load $E_{res,c}$.

Finally, we also define the mixed energy Emix over a determined observation period as the integral, over this period, of the product Inet*Vres. This mixed energy can be established on the side of the source Emix,s and of the load Emix,c.

As mentioned earlier, when the network in FIG. 3 is perfectly balanced, the residual voltages and currents are zero. The residual and mixed energies on the side of the source $E_{res,s}$ $E_{mix,s}$ and on the side of the load $E_{res,c}$ $E_{mix,c}$ are also zero.

Parallel Type Fault Between the Power Conductors (Parallel Arc)

With reference to FIG. 4a, a parallel type fault between the two power conductors C1, C2 of the line of the network shown in FIG. 3 can be modelled as a dipole DP1 placed between these two conductors C1, C2. The difference of the network voltages on the side of the source $V_{net,s}$ and of the load $V_{net,c}$ is not affected by the presence of this dipole, but the circulation of a current in the dipole DP1 between the power conductors C1, C2 leads to unbalance the network currents $I_{net,s}$ $I_{net,c}$ on both sides of the line which are not identical anymore.

In the event of such a parallel type fault between the two power conductors C1, C2, there is no residual current or residual voltage.

A parallel type fault between the two power conductors C1, C2, such as a parallel arc, manifests itself as a difference in the currents $I_{net,s}$ $I_{net,c}$ and/or the network energies $E_{net,s}$ $E_{net,c}$ over the determined observation period, on both sides of the line. We note that in the case of such a parallel arc, the energy dissipated in the dipole DP1 which models it is much higher than the nominal power of the network, so that the difference of the currents $I_{net,s}$ $I_{net,c}$ and/or of the network energies $E_{net,s}$ $E_{net,c}$ appearing on both sides of the line allows to clearly detect this fault.

Practically, in the electrical network of FIG. 2, the occurrence, during a period j, of a parallel type fault between two power conductors C1, C2 connecting two detection devices $D_i$, $D_{i+1}$ of respective identifier i and i+1 can be detected by the supervision device V, by comparing to a threshold network energy value $S_{i,i+1}$ the difference of the network energies $E^j_{net,i}$ $E^1_{net,i+1}$, respectively supplied by means of the communication bus BUS by the detection devices $D_i$, $D_{i+1}$. It is also possible to use a difference between the currents $I^j_{net,i}$ and $I^j_{net,i+1}$ supplied respectively by means of the communication bus BUS by the detection devices $D_i$, $D_{i+1}$ to detect and localize a parallel type defect. It can be provided that the supervision device V may be configured to perform other types of processing on the supplied network energies to detect the occurrence of a fault of this type. For example, the energies supplied during several successive observation periods may be summed up before to proceed to the difference and the comparison with the threshold, in order to extend the observation period. This allows to adapt the trigger times according to the power of the fault: a very high-power fault will cause the supervision device V to react much faster than a lower power defect. This also allows to ensure that no protection is triggered if a non-persistent transient fault occurs.

Generally speaking, the trigger thresholds associated with two detectors of index i, i+1 are adapted according to the nature of the equipment E of the network 1 which can be localized between two detection devices $D_i$, $D_{i+1}$ to take into account, for example, losses in lines or in connectors, or even the consumption of an equipment E of parallel nature and of known maximum power and lower than a characteristic power of fault.

Parallel Type Fault Between a Power Conductor and an Outer Element (Insulation Defect).

With reference to FIG. 4b, a parallel type fault between one of the power conductors C1, C2 and an element outside the network can be modelled as a dipole DP2 placed between this conductor and this outer element. The outer element can be the common conductor Cc, a mechanical mass of the network, or any other potential.

The network voltages appearing on the side of the source $V_{net,s}$ and of the load $V_{net,c}$ are not necessarily affected by the occurrence of such a fault, it depends on the scheme of connection to the ground retained for the network. There is almost no impact on the network, residual and mixed energies in case of a first fault of a regime referred to as "IT regime", i.e. when the network is isolated from the ground or the mechanical mass. Nevertheless, to identify the occurrence of this type of fault in this type of network, a permanent insulation controller can be exploited, as described in more detail below. On the other hand, significant differences in the network, residual or mixed energies, will develop in the event of an insulation defect in a non-isolated network or in the event of a second fault in an isolated network.

A current then flows in the dipole DP2 between the power conductor and the outer element. Consequently, the current flowing on the side of the source S and/or of the load C on this power conductor differs from that flowing on the other conductor. This difference causes a residual current on the side of the source $I_{res,s}$ and/or on the side of the load $I_{res,c}$. The current flowing through the dipole DP2 develops a potential difference which also affects the voltage of the power conductor and gives rise to a residual voltage on the side $V_{res,s}$ of the source or of the load $V_{res,c}$.

Consequently, the occurrence of an insulation defect gives rise to a residual energy Eres,s or Eres,c on one side or the other of the line over a determined observation period. In the event of a non-true defect, the residual energy variation will be more sensitive than the network energy variation.

By measuring, during a period of time j, in a measurement area of the network and with the help of a detection device D of identifier i arranged in this area, the residual energy $E^j_{res,i}$, it is thus possible to detect the occurrence of such a fault, for example by comparing the measured residual energy $E^j_{res,i}$ with a determined threshold Si. This detection can be carried out locally, without necessarily calling on the supervision device V of the network and without communicating the energy measurement to this device. Such a local detection may allow to activate a local protection device P, in order to isolate a portion of the network 1, as previously explained.

Such an insulation fault can lead to the occurrence of a residual energy that may be much lower than the nominal energy of the network. In addition, natural asymmetries can generate biases in the local calculation of the residual energy (e.g. if the voltage of the common conductor Cc is not exactly half the network voltage). The detection and the localization of this fault is then facilitated by taking the difference of these energies measured upstream and downstream of the line, using two detection devices D. The processing capacities of the supervision device V, to which the residual energy measurements are communicated, are then exploited, as was presented in the previous case.

In other cases, the residual energy may be relatively small, and it may then be advantageous to sum the residual energies measured over several successive observation periods before proceeding to the comparison with the threshold, in order to extend this observation period.

In the case of an insulated network (regime IT type), which will be able to continue to be fully operational in the event of a first insulation defect, a permanent insulation controller (PIC) must be present to detect this first defect. This PIC measures the impedance between the network and the mechanical mass or the ground and to do this, it typically injects a common mode voltage (a residual voltage) into the network at a very low frequency (typically 1 Hz). When the network is healthy, there is no common mode current (residual current) and therefore no residual energy. In the event of a first insulation defect, the PIC will cause the occurrence of residual currents and a residual energy, in particular at the excitation frequency of the PIC. Thus, it is advantageous to measure a residual energy at the excitation frequency of the PIC only in order to facilitate the localization of an insulation defect. To do this, the PIC and the detection devices D must be synchronized, for example by sending a synchronization clock on the communication bus BUS.

Series Type Fault (Series Electrical Arc)

With reference to FIG. 4c, a series type fault, such as a series arc occurring on one of the lines L, most often on a connection terminal B, sometimes within the power conductors C1, C2, can be modelled as a dipole DP3 placed in series on this conductor.

The currents of network on the side of the source $I_{net,s}$ and on the side of the load $I_{net,c}$ are almost not affected by the presence of this dipole DP3. But the flow of a current in this dipole DP3 gives rise to a voltage $V_d$ which unbalances the voltage carried by this power conductor, while the other conductor is not affected. This dissymmetry gives rise to a residual voltage on the side of the source $V_{res,s}$ and/or on the side of the load $V_{res,c}$.

Consequently, the occurrence of a series defect gives rise, over a determined observation period, to a mixed energy Emix,s or Emix,c on one side and/or the other of the line. The series type defect also generates a variation in network energy, but this is much lower than the nominal energy and it will be impossible to detect the occurrence of a series defect reliably and early via the analysis of the network energy. On the other hand, a series defect does not generate any variation in the residual energy.

By measuring, during a period of time j, in a measurement area of the network and with the help of a detection device D of identifier i arranged in this area, the mixed energy $E^j_{mix,i}$ it is thus possible to detect the occurrence of such a fault, for example by comparing the measured energy $E^j_{mix,i}$ with a determined threshold Si. This detection can be carried out locally, without necessarily calling on the supervision device V of the network and without communicating the measurement to this device. Such a local detection can allow to activate a local protection device P, in order to isolate a portion of the network, as previously explained. It is also possible to use a difference between the residual voltages $V^j_{res,i}$ and $V^j_{res,i+1}$ supplied respectively by means of the communication bus BUS by the detection devices $D_i$, $D_{i+1}$ to detect and localize a serial type defect.

We note that the mixed energy Emix is caused by the dissymmetry between the first and the second power conductor generated by the presence of the series dipole DP3 which models a series type fault. In order to take full advantage of the detection capacity from the mixed energy, we will therefore try to avoid intentionally making the power conductors C1, C2 asymmetrical. For this reason, one of the two power conductors should not be confused with the mechanical mass of the network. It is also important to avoid inserting a connector or any other element on only one of the power conductors in a line L.

In case of a "natural" dissymmetry of the network producing a mixed energy in some measurement areas even in normal operation of the network, this mixed balance energy can be determined and taken into account for the detection of a fault, for example by adjusting the level of the comparison threshold Si, or by identifying a temporal variation of the mixed energy. A calibration phase of the detection devices D of the network 1 (or of the supervision device V) can thus be provided, aiming at entering the level of the threshold value beyond which a measurement of mixed energy or residual voltage testifies to the occurrence of a fault of a serial type. Typically and as an example, a series electrical arc produces a residual voltage between 20V and 50V. We can then choose the thresholds of detection of the difference of the residual voltages towards 2V and, for the mixed energy, 2V that multiplies the value of the current $I_{net}$. Thus, the detection threshold Si can advantageously be made to evolve according to the average value of the network current $I_{net}$.

As in the 2 preceding types of faults, one can also supply the measurement of mixed energy prepared by each of the detection devices D to the supervision device V, which will then be able to detect more finely and localize a series type defect by analysing the differences of mixed energy between 2 detection devices Di and Di+1. Successive energy measurements can also be processed, in sum or in difference, in particular to allow the detection of the low power defects over a longer observation period. The detection thresholds that apply respectively to the measurements of network, residual and mixed energies, or to the differences in these energies between two devices, may be distinct from each other. It is specified that according to the conventions and the nature of the defect (for example a series arc on the first power conductor C1 or a series arc on the second power conductor C2, these thresholds can be negative and the notion of energy "higher" than a threshold is understood as absolute value.

To summarize this part of the description, we note that the measurement over a determined observation period and in a determined area of the network, of the network energy $E_{net}$, of the residual energy $E_{res}$ and of the mixed energy $E_{mix}$ allows to detect and localize the occurrence of various faults. This detection can be carried out locally in the measurement area by the simple observation of a network, residual or mixed energy exceeding a determined threshold. More accurate localization of these faults and the detection of a wider variety of faults may require exploiting the measurements of these energies between two measurement areas of the electrical network 1.

In particular, it is possible to exploit the measurement of the mixed energy at the level of a single measurement area to detect the occurrence of a series-type fault, such as an electric arc in a conductor of a line of the network or of an equipment, for example a source, which was not easily possible with the techniques known in the prior art. This aspect is therefore an important advantage of the solution described here.

To facilitate this detection, the lines L of the electrical network 1 are advantageously designed to be as symmetrical as possible. In this respect, it is advantageous to choose the power conductors connecting the electrical equipment E to each other so that they are identical or so that they have identical geometries (diameter and nature of the conductor and of the insulator). It can also be provided that the power conductors and the common conductor are assembled parallel to each other to form a cable harness, e.g. by means of cable ties, or even a single cable, e.g. by embedding the conductors in an insulating material. This limits the asymmetries in the interaction of the conductors with the environment.

For the same reason of seeking balance, and in order to have zero residual voltages in the absence of defect, the common conductor can be connected to a midpoint of the electrical equipment forming sources or loads. And we can equip the electrical equipment E forming sources or loads and not having a midpoint, a resistive bridge between the two power conductors to connect the common conductor to the midpoint of this resistive bridge.

In order to be able to elaborate a measurement of the network, residual and/or mixed energies, the fault detectors D are equipped with voltage and current sensors allowing to form an image of the voltages carried by the conductors or flowing in the conductors to which they are connected, in the measurement area. Advantageously, these sensors have a good linearity, are slightly impacted by the environment (the temperature, the mechanical constraints, etc.) so as not to bias the energy calculations between two distant points of the network and are not excessively sensitive to aging. They also have wide measurement passbands, so that the measured energies take into account the spectral disparity of the signals, voltages and currents of the network, in particular during the occurrence of a fault.

Generally speaking, these sensors are adapted to elaborate a faithful measurement in a frequency range between 0 Hz and 1 kHz, or even 10 kHz or 100 kHz, or even 1 MHz or 10 MHz or 100 MHz. The measuring members O1, O2 may each comprise one or a plurality of such sensors. This can include in particular sensors working in different frequency ranges. It can thus be envisaged that a measuring member O1, O2 has a sensor allowing for measuring a direct component of a signal and/or a sensor allowing for measuring certain non-direct spectral components of a signal.

Advantageously, the sensors are adapted to supply measurements of a direct component of the current or of the voltage of the network 1, whether it is an AC or DC network, with a response time compatible with a required detection latency, for example less than or equal to one millisecond. As a result, the measurement passband of these sensors is typically between 0 Hz and 1 kHz or several kHz. The measuring of the energies from measurements taken in this frequency range is sufficient to detect most faults, in particular the series or parallel electrical arcs, with the required responsiveness.

In the case of an alternating AC network with active electrical equipment, sources or loads, the energies established from the measurement of the direct components of the current and of the voltage, can testify to a fault in the operation of this equipment. The power transformers can also be protected against the effects of the magnetic saturation induced by these direct components. In the case of an alternating AC network with an IT-type (insulated) grounding scheme, the measurement of the direct components will also allow to localize the first defect as mentioned above.

The sensors can also be adapted to supply an accurate measurement of the voltages and of the currents in the frequency of the network to detect the faults of overconsumption type or insulation defects. They can also operate beyond these frequencies in a very high frequency range beyond 100 MHz. This is especially true for detecting partial discharge type defects in insulators of the conductors of the network.

Detection Device

The principles underlying the invention having been stated, a detection device D in accordance with the invention, and shown in FIG. 5, is now presented in detail. As already stated with reference to the description of FIG. 1, such a detection device D is adapted to be connected to the power conductors C1, C2 of the network 1 and to the common conductor Cc, and at the level of a measurement area of this network 1. These power conductors can be those forming a line L of the network 1, or preferably those internal to the electrical equipment E of the network. In such a case, the measuring members O1, O2 of a detection device D are preferably placed upstream of the terminals B connecting a source to the distribution lines L of the network and, preferably, downstream of the terminals B connecting a load to these lines L. In this way, it will be possible to detect and localize a defect in these terminals B.

In its simplest version, the detection device D is designed to detect at least the serial type faults, and is therefore configured to elaborate a quantity representative of a mixed energy which transits in the measurement area and during a given observation period.

To this end, the detection device D comprises a first measuring member O1, coupled to at least some of the conductors, allowing to elaborate a first quantity $V_{res}$ representative of the common mode voltage of the power conductors C1, C2, i.e. the residual voltage. This first member O1 can thus comprise sensors of the voltage present on each of the power conductors C1, C2 with respect to the common conductor Cc. In a later part of this description, several preferred embodiments of this first member O1 will be given.

The detection device D also comprises a second measuring member O2, coupled to at least some of the conductors, and allowing to elaborate a second quantity $I_{net}$ representative of a network current. As an example, this second member O2 may comprise a first current sensor for measuring the current flowing on the first power conductor C1 and a second current sensor for measuring the current flowing on the second power conductor C2, the difference of the measurements supplied by these sensors being representative of the second quantity $I_{net}$. In some cases, a single current sensor can be provided to measure, on only one of these conductors, a quantity that is assimilated as a first approximation to the network current, and thus to the second quantity $I_{net}$.

Advantageously, the current sensor or sensors of the second member are Hall effect sensors, Neel Effect® sensors or sensors comprising a resistive shunt so as to draw a direct component of the measured currents. It can be provided that the current sensor or the current sensors of the second member comprise Rogowski type sensors or air transformers. The extended passband, the linearity and the stability of these types of sensors can be used during the measurement of non-direct spectral components. This is particularly true in the case of a research of partial discharge type defect.

Whatever the nature of the components with which the first and second measuring members O1, O2 are implemented, they allow to elaborate directly or indirectly (i.e. with the help of a calculator UP which will be presented hereafter) a quantity $I_{net}$ representative of the network current and a quantity $V_{res}$ representative of the residual voltage. These two quantities allow to establish an image of the mixed energy $E_{mix}$ which transits over a determined observation period, in the measurement area of the detection device D defined by its position in the network. To allow this, the detection device D also comprises a calculator UP, connected to the first and to the second measuring member O1, O2. This calculator UP can take any suitable form, but it is preferably a digital calculator having inputs allowing to digitize with high-frequency the analogue measurements supplied by the measuring members O1, O2. This calculator can be implemented by a microcontroller, a FPGA, a DSP, an ASIC or any other form of digital or analogue calculation device that is suitable.

The detection device D may optionally comprise a converter CON, shown in dotted line on FIG. 5, adapted to draw energy from the power connectors C1, C2 and/or from the common connector Cc to feed electrically the calculator UP and all the other active elements that make up the device D, it being understood that the power required is particularly reduced. When designed to be connected to a communication bus BUS, as shown in relation to FIG. 1, the detection device D can alternatively be fed by a dedicated port of this bus.

For completeness, but not as an essential feature, the detection device may also comprise a network controller NET, which may be implemented by the calculator UP, and allowing to interface the device D with the communication bus BUS. The device D is associated with an identifier, such as a network address, which allows it to be identified on the network. The bus BUS allows to communicate a clock information to the calculator UP, or the device D can have a dedicated clock terminal allowing to receive this information. In this way, the calculator UP can time-stamp the data it elaborates before placing them on the communication bus BUS. In this way, the supervision device V, to which several detection devices D similar to the one shown in FIG. 5 are connected as we have already seen, can order the data received from these devices D and exploit them in a temporally coherent sequence.

The calculator UP of the detection device D is configured by hardware or by software to make the acquisition of the measurements supplied by the first and the second measuring member O1, O2, and to determine an image of the mixed energy Ejmix which transits, during a given period of time j, in the measurement area. The frequency of acquisition of the measurements by the calculator is typically less than a millisecond, for example it can be of the order of 100 microseconds or 10 microseconds, or even 100 ns or less depending on the passband of the measuring members O1, O2. The observation period can be between 100 ns and 10 s. It is specified that the calculator UP can be configured to digitally process the measurements supplied by the measuring members O1, O2 or be configured to combine a plurality of measurements supplied by each of these members O1, O2 to determine the image of the mixed energy Ejmix. For example, the calculator can be configured to integrate a measurement supplied when a sensor of a member O1, O2 delivers an information proportional to the time derivative. It can be configured to add a direct current/voltage measurement and a variation measurement of this current/voltage (after its integration), when these two measurements are supplied separately for one of the two measuring members O1 and/or O2.

The calculator UP may also be configured to exploit the determined mixed energy $E^j_{mix}$ so as to detect a series-type fault in the network, as discussed in an earlier section of this description. In particular, it can be determined whether this determined mixed energy $E^j_{mix}$, or a variation of this energy between two distinct observation periods, exceeds a predetermined threshold. As we have also seen, the calculator can be configured to sum the determined mixed energies $E^j_{mix}$, $E^{j+1}mix \ldots, E^{j+n}_{mix}$ over consecutive observation periods j, j+1, . . . , j+n. The accumulated mixed energy is then compared to a threshold so as to determine the occurrence of a fault.

When such a fault is confirmed, and regardless of the way in which the calculator exploits the mixed energy measurement or measurements $E^j_{mix}$, the calculator UP can generate a signal S indicating this fault, the signal being able to be transferred to a detection terminal of the device D. In such a case of use of the detection device D, it is understood that the presence of the communication bus BUS is not necessary. Alternatively, the signal S can be placed on the communication bus BUS. Alternatively, the calculator UP can simply elaborate by calculation the data representative of the mixed energy $E^j_{mix}$ and place this data on the communication bus BUS. In this last alternative, the detection of a fault in the network is entirely implemented by the supervision device V as previously presented.

In a more complete embodiment of the detection device D, the latter may comprise other measuring members or more complete first and second measuring members O1, O2 allowing the calculator UP to determine, in addition to the image of the mixed energy $E^j_{mix}$, the image of the network energy $E^j_{net}$ and of the residual energy Pres which transit in the measurement area during the determined observation period j. In addition to the second quantity $I_{net}$ representative of the network current and the first quantity $V_{res}$ representative of the residual voltage, these members allow to establish a third quantity $V_{net}$ representative of the network voltage and a fourth quantity $I_{res}$ representative of the residual current. This more complete embodiment is symbolized by the dotted arrows $V_{net}$ and $I_{res}$ in FIG. 5.

Detection Device Integrated into an Active Equipment

A detection device D can be integrated into an electrical equipment E comprising a load or an active source, for example an inverter, or a generator whose correct operation is to be monitored. In this case, and in order to be able to detect a series arc, the detection device D will be positioned as close as possible to the active portion of the equipment E, i.e. just before the power switches, and downstream of the connection terminals B of this equipment and downstream of a possible protection device P when this equipment E is a load. Preferably, a resistive dividing bridge is placed between the power conductors C1, C2, the midpoint of which is connected to the common conductor closest to the active load. It will be possible to measure a mixed energy, image of the presence of a defect in series in the internal conductors of the monitored equipment E.

In the same way that we tried to distinguish the energies in the network, we can try to distinguish the energies consumed by a load. For this, we can define 4 types of energy:

An energy referred to as "useful energy", characterised by current-voltage spectra at the frequency of the network, between 0 and 10 Hz for a direct DC network or at +/−5 Hz of the network frequency for an alternating AC network.

A harmonic distortion energy, characterised by current-voltage spectra in a band of +/−5 Hz around multiples of the network frequency (for an alternating network). This energy is essentially reactive.

A switching energy, characterised by current-voltage spectra at frequencies multiple of a chopping frequency FHACH of the active load. This energy is limited to bands of +/−5 Hz around these multiple frequencies n*FHACH.

An additional energy that is not in any of the above bands. A priori, only noise or energy is found in this band in the event of electric arc (series or parallel) or short-circuit.

A detection device D integrated in the equipment E will establish the network $E_{net}$, residual $E_{res}$, and mixed $E_{mix}$ energies as presented in the previous sections of this description in order, for example, to transmit this information to the supervision device V. In addition, the detection device D will be able to establish a decomposition of these energies according to the four aforementioned categories in order to identify the contributors. For this purpose, the detection device D can apply a filtering on the quantities supplied by the measuring members O1, O2 in order to separate these quantities according to the various spectral bands described, before proceeding to the calculation of the energies in each of these bands with the help of the calculator UP.

This filtering can implement comb filters implemented by the calculator UP, in order to be able to enslave in particular the frequency of the comb with the chopping frequency. For this purpose, it can be provided that this chopping frequency is supplied in the form of a chopping clock FHACH resulting from the active load and presented on a dedicated connection terminal of the detection device (shown in FIG. 5).

Thus, we can establish by means of the calculator UP:
- a network energy "useful $E_{net}$" as the useful energy in the load or the source. This energy may reveal an overload or a parallel arc.
- A network energy "switching $E_{net}$" as the energy lost in the switching structures of the electrical equipment E. This energy may reveal a switching fault, such as a short-circuit in the arm (not respecting dead times) or a switch fatigue.
- A network energy "additional $E_{net}$" as being the additional energy, for example due to a parallel or series arc or a short-circuit.
- A mixed energy "Switching $E_{mix}$" representative of a switching fault in a more refined way than the mixed energy $E_{mix}$ alone. In particular, the presence of a series arc in the equipment E can be identified by eliminating the switching mixed energy from the mixed energy $E_{mix}$.

These energies can be placed on the communication bus BUS and transmitted to the supervision device V in order to be exploited.

Preferred Embodiment of the First Measuring Member

To ensure a detection and a localization of faults, and in particular of a series arc in an alternating or direct network, it may be sufficient, as we have seen, to measure the direct components of a residual voltage $V_{res}$ and of a network current $I_{Net}$. These measurements are carried out by respectively the first and the second measuring member O1, O2 of the detection device D.

For the measurement of the direct component of the common mode voltage, i.e. the residual voltage $V_{res}$, the first measuring member O1 can be equipped with a resistive voltage dividing bridge, a first electrode T1 of the bridge being electrically connected to the first power conductor C1, a second electrode T2 being electrically connected to the second power conductor C2, and a third electrode T3 being electrically connected to the midpoint of the bridge. The voltage developing between this midpoint, on the third electrode T3, and the common conductor CC via a measuring dipole SH supplies the common mode voltage. Typically, this dipole is formed by a resistor. A schematic diagram of such a bridge is shown in FIG. 10 in which the resistors R1, R2 forming the bridge are precisely chosen to have the same value, to within 1%, or even to within 0.1% or even 0.01%, and limiting their drift in time and temperature to a minimum. In such a scheme, the quantity representative of the common mode voltage $V_{res}$ is equal to the common mode voltage present on the two power conductors multiplied by a gain equal to SH/[R1/2+SH]. This gain allows to reduce the dynamic range of the measurement in order to adapt it to that of the electronics of the measuring member. As an illustration, by choosing R1=1 MOhms, and SH=50 kOhms, a gain of 1/11 allows to reduce a common mode voltage of 50V on the power conductors to a quantity $V_{res}$ representative of the order of 5V so that it can be processed by the rest of the electronics of the measuring member. The values of the resistors R1, R2 and SH should be chosen in order to adapt to the quantities of the network and to the dynamics of the measurement electronics.

As already mentioned, the detection device D is equipped with connection terminals B intended to associate the device with the conductors C1, C2, CC. These terminals B are therefore also electrically connected to the electrodes of the resistive bridge.

For example, the resistive dividing bridge can be composed of a thin layer (or thin film) or thick layer (or thick film) resistor allowing to ensure an adequate voltage withstand and control the transformation ratio without thermal or time drift. To ensure a perfect symmetry between the two resistive elements R1, R2, and thus reduce the drifts over time and as a function of the temperature, a resistive divider referred to as a "3-terminal units" divider is used to form these resistive elements.

When it is chosen to measure non-direct components of the residual voltage, it is preferable that the sensor allowing this measurement is insensitive to a possible direct component, is perfectly linear, that its gain is controlled and does not drift either in temperature or in time. This is especially true for a partial discharge type defect detection. To this end, and in a preferred embodiment, a schematic diagram of which is shown in FIG. 6, it is proposed to use two capacitive elements EC1, EC2 arranged in a bridge between the two power conductors C1, C2, having substantially identical capacitance values to within 1%, or even 0.1%, or even 0.01%. These elements are respectively each connected at a midpoint M. The midpoint M is electrically connected to the common conductor Cc via a measuring dipole SH of the common mode voltage.

The currents I1, I2 flowing in the capacitive elements EC1, EC2 are respectively proportional to the derivatives, as a function of time, of the potentials $V_{c1}$, $V_{c2}$ carried by the power conductors C1, C2. The capacitance values of the capacitive elements EC1, EC2 being identical, the differential current I1-I2 is proportional to the derivative of $V_{r1}+V_{r2}$, i.e. the common mode voltage $V_{res}$. Thus, it is sufficient to measure this differential current I1-I2 for example by means of a current sensor arranged in a branch of the circuit connecting the midpoint M between the capacitive elements and the common conductor Cc, then to integrate it as a function of time in order to obtain the residual voltage $V_{res}$. To this end, the measuring dipole SH placed between the midpoint M and the common conductor Cc is part of the current sensor and has a low impedance of less than 1 kOhm or even less than 1 Ohm. The integration is not necessarily carried out analogically in the first measuring member itself as symbolized in FIG. 6, and the calculator UP can be configured to perform this operation.

Alternatively, non-direct components of the common mode voltage $V_{res}$ between the midpoint M and the common conductor Cc can be measured directly by choosing a high impedance of the measuring dipole SH, greater than 1 kOhm, or even greater than 1 MOhm. The member O1 then comprises a capacitive divider delivering the residual voltage with respect to the common conductor Cc. This second solution is however less suitable for severe electromagnetic environments (such as in an aircraft), but may be suitable in a photovoltaic farm as a complement to the direct components.

To ensure a perfect symmetry between the two capacitive elements EC1, EC2, and thus reduce the drifts in time and temperature, a capacitor referred to as "3 terminal unit capacitor" is used to form these capacitive elements.

Such capacitors comprise electrodes of type A, type B and type G (FIG. 7), each type being electrically associated with a terminal unit, and stacked on top of each other and insulated from each other by a dielectric, and following an alternation A, G, B, G, A, G, B, etc. The electrode G of the capacitor is directly the midpoint M, which is connected to the common conductor Cc via the measuring dipole SH, and the electrodes of types A and B are respectively connected to the power conductors C1, C2 by means of the three terminal units of the capacitor. The advantage of this structure is to obtain almost identical capacitive elements EC1, EC2, invariant in time and stable in temperature between the terminal unit of type G and the terminal unit of type A on the one hand, and between the terminal unit of type G and the terminal unit of type B on the other hand. The three terminal units capacitors also have a very low parasitic inductance, which allows to proceed to measurements at very high frequencies.

The dielectric of the capacitor can be of the C0G or NPO type. It is also possible to use a paper-based dielectric, possibly filled with oil, or with mica or other insulators, allowing to obtain an excellent behaviour in high frequencies, stable in time, for medium or very high voltages.

The capacitor may be a film capacitor, in which each type of conductor and the dielectric are in the form of a film, and are stacked on top of each other. The stack can be rolled up to form a cylindrical or parallelepiped three-terminal unit capacity.

Of course, these concepts can be extended to form capacities with more than three terminal units, which can be useful when the network is three-phase for example.

Advantageously, it can be provided that the first measuring member O1 also allow to establish the network voltage $V_{net}$, i.e. the differential mode voltage, in addition to the residual voltage $V_{res}$, i.e. the common mode voltage. For example, a resistive and/or capacitive voltage divider can be used depending on the nature of the spectral components of the network voltage $V_{net}$ that we wish to measure.

FIG. 11 shows a resistive dividing bridge with 4 resistors R1, R1', R2, R2' and 5 electrodes T1 to T5. We find the 2 electrodes T1, T2 allowing to connect the bridge to the conductors C1, C2, the third electrode T3 allowing to draw and measure a midpoint voltage corresponding to the common mode voltage between the two power conductors. The series resistance R1+R1' formed by the resistors R1, R1' arranged on one side of the midpoint is therefore equal to the series resistance R2+R2' formed by the resistors R2, R2' arranged on the other side of the bridge relative to the midpoint. Complementary electrodes T4, T5 arranged at the level of the intermediate points of series connection of the resistors in each branch of the bridge, allowing to supply a voltage image of the network voltage Vnet by means of a control gain (defined by the relation (R1+R1')/(R1+R1'+R2'+R2)). The voltage drawn off between the complementary electrodes T4, T5 is thus compatible with the rest of the processing operated by the electronic acquisition chain. For example, if the network voltage Vnet is about 800V, we can choose the resistors of the bridge so that the gain is about $\frac{1}{100}$.

For example, the two resistive elements R1, R2 can be chosen to be equal to each other, for example between 10 kOhms and 1 MOhms, and equal to 99 times the first resistor R1' connected to the midpoint T3. The other resistor R'2 connected to the midpoint, on the other side of this point, is also chosen so that it has the same value as the first resistor R1'. The control gain applied to the differential mode voltage present between the two power conductors, equal to (R1+R1')/(R1+R1'+R2'+R2), is then equal in this case to R'1/(R1+R'1).

Thus, and in a preferential way, the resistive bridge is implemented by a single component of the paired resistive divider type, i.e. in which the value of certain resistors is fixed in advance according to a predetermined ratio with respect to the other resistors, and in which all the resistors are carried out on a same support ("thick film" or "thin film") in order to reduce the thermal drifts. The result is a resistive divider with 3 terminal units or 5 terminal units, depending on the chosen embodiment.

In the case of the measurement of non-direct components, and in order to improve the performance in harsh environment, it is sufficient to realize that the common mode current I1+I2 flowing in the two capacitive elements EC1, EC2 of the capacitive divider shown in FIG. 6 forms an image of the derivative as a function of time of the differential mode voltage $V_{net}$. By equipping the first member O1 of a common mode current sensor, it is possible to establish this differential mode voltage $V_{net}$. This common mode current sensor can be formed by two air coils, for example two Rogowski probes, respectively arranged in the vicinity of the capacitive elements EC1, EC2.

An example of the implementation of these principles is then shown in FIG. 7. A cylindrical three-terminal unit capacitor has been formed from films of type A, B, G wound as previously described, and whose three terminal units T1, T2, T3 are electrically connected to the first power conductor C1, the common conductor via the dipole SH and the second power conductor C2, respectively. The resistance of the measuring dipole SH between the terminal unit T2 (forming the midpoint M between the two capacitive elements EC1, EC2 in the capacitor) and the common conductor C allows the extraction of a quantity representative of the common mode voltage $V_{res}$, as previously described. Two Rogowski type current sensors RG1, RG2 are arranged in a winding around the cylindrical capacitor in order to draw an image of the currents I1, I2 flowing in the capacitor. The quantities supplied by these sensors can be combined to give an image of the differential mode voltage $V_{net}$.

In an advantageous embodiment, the current sensors allowing to elaborate images of the differential mode voltage $V_{net}$ and/or the common mode voltage $V_{res}$ implement a planar coil technology. In this case, two types of coils arranged in parallel but distinct planes can be realized, which allow to measure respectively the common mode current (image of the derivative of the differential mode voltage $V_{net}$) and the differential mode current (image of the derivative of the common mode voltage $V_{res}$). These two planes can be localized in different layers of a multilayer printed circuit board in which the planar coils have been localized.

As shown in FIGS. 8a, 8b, this printed circuit board can comprise, on a first layer, two tracks P1, P2 respectively electrically connected to the power conductors C1, C2. These tracks are also connected to the three-terminal unit capacitor C3, whose midpoint M is electrically connected to the common conductor Cc via a measuring dipole SH, formed here by a single conductor, in order to form the differential current. The planar coils for measuring the differential current Bcd, for example four of these coils formed by two pairs of coils mounted in anti-serial (FIG. 8a), can be placed on a second layer of the board and the planar coils for measuring the common current Bcc, which can also be four, can be placed on a third layer of the board (FIG. 8b).

This variant is advantageous in that it allows to eliminate the influence of a current flowing in the common conductor, regardless of its frequency. The planar coils deliver an electromotive force proportional to the second derivative of the measured voltage with respect to time, which must therefore be integrated twice before proceeding with the calculation of the energies. This assembly is preferably carried out according to a printed circuit board technology for the power applications in order to control the geometry of the coils and to obtain a known transformation ratio without calibration and with an extremely low drift in temperature and time. Note that this approach, in general, can be implemented to measure the differential mode voltage Vnet or the common mode voltage Vres.

Generally speaking, the measuring member O1 can be equipped with sensors for the direct component and the variable component of the common mode voltage Vres. It can also be equipped with sensors for the direct component and the variable component of the differential mode voltage Vnet.

Of course, the invention is not limited to the described embodiments and alternative embodiments may be made without departing from the scope of the invention as defined by the claims.

Thus, a device D in accordance with the invention provides for the elaboration of a quantity representative of the mixed energy $E_{mix}$ from the common mode voltage and the network current and which transits in the measurement area. This quantity is processed and compared to a threshold to identify a fault. It is perfectly understandable that the quantity representative of the mixed energy can correspond to the common mode voltage which is compared to a threshold modulated according to the intensity of the network current. In all cases, the first and the second quantity that make up the mixed energy $E_{mix}$ are exploited to generate a signal S indicating the fault of the network. It is therefore not necessary for a detection method in accordance with the invention to implement a formal energy calculation, although this makes a particular embodiment.

The invention claimed is:

1. A device for detecting a fault, in particular series arcs, in an electrical network, in particular DC, comprising at least one electrical equipment electrically connected to a first power conductor, a second power conductor and the electrical network being equipped with a common conductor, the device being intended to be connected to the power conductors of the network and to the common conductor at the level of a measurement area and comprising:
a first measuring member allowing to elaborate a first quantity ($V_{res}$) representative of the common mode voltage present on the power conductors;
a second measuring member allowing to elaborate a second quantity ($I_{net}$) representative of a network current flowing in the power conductors;
a calculator, connected to the first and to the second measuring members, the calculator being configured to determine, over a determined observation period, a quantity representative of an energy referred to as "mixed energy" ($E_{mix}$) defined as the integral over the determined observation period of the product of the common mode voltage and the network current and which transits in the measurement area, the quantity representative of the mixed energy ($E_{mix}$) being determined from the first quantity ($V_{res}$) and from the second quantity ($I_{net}$).

2. The detection device according to claim 1 wherein the calculator is also configured to exploit the quantity representative of the determined mixed energy ($E_{mix}$) and to generate a signal indicating the fault of the network.

3. The detection device according to claim 1, wherein the first and the second measuring members are configured to elaborate, respectively, the first quantity ($V_{res}$) representative of the direct component of the common mode voltage and the second quantity ($I_{net}$) representative of the direct component of the network current.

4. The detection device according to claim 1, wherein the first measuring member also allows to elaborate a third quantity ($V_{net}$) representative of the differential mode voltage present between the two power conductors, and the calculator is also configured to determine, over the determined observation period, a quantity representative of a network energy ($E_{net}$) which transits in the measurement area, from the third quantity ($V_{net}$) and from the second quantity ($I_{net}$).

5. The detection device according to claim 1, wherein the second measuring member also allows to elaborate a fourth quantity ($I_{res}$) representative of a common mode current flowing in the two power conductors, and the calculator is also configured to determine, over the determined observation period, a quantity representative of a residual energy ($E_{res}$) which transits in the measurement area from the fourth quantity ($I_{res}$) and the first quantity ($V_{res}$).

6. The detection device according to claim 1 also comprising a network controller for interfacing the calculator with a communication bus.

7. The detection device according to claim 6 wherein the communication bus is the common conductor, and the network controller is connected to the common conductor.

8. An electrical equipment, such as an electrical source or load, comprising a detection device according to claim 1.

9. A system for localizing a fault in an electrical network comprising at least one first power conductor and a second power conductor, the localizing system comprising:
a common conductor;
two detection devices according to claim 1 connected at the level of respective measurement areas to the power conductors and to the common conductor;
a supervision device connected by a communication bus to the two detection devices, the supervision device comprising a calculation member configured to exploit the information supplied by the detection devices on the communication bus in order to localize a fault occurring in the electrical network in the section of the conductors comprised between the two detection devices.

10. An electrical network, direct or alternating, comprising at least two electrical equipment connected by at least one first power conductor, a second power conductor, the electrical network being equipped with:
a common conductor;
a plurality of detection devices according to claim 6 connected at the level of respective measurement areas to the power conductors and to the common conductor;
a supervision device connected by the communication bus to the detection devices.

11. The electrical network according to claim 10, wherein the communication bus comprises a clock information.

12. The electrical network according to claim 10, wherein the supervision device comprises a calculation member configured to exploit the information supplied by the detection devices on the communication bus in order to detect a fault occurring in the electrical network.

13. The electrical network according to claim 10, wherein the geometries of the power conductors are identical.

14. The electrical network according to claim 10, wherein at least one of the electrical equipment is a source, and the common conductor is connected to a midpoint of the source.

15. The electrical network according to claim 10, wherein the power conductors and the common conductor are assembled together in parallel to form a single cable or a harness.

16. A method for detecting a fault with a detection device according to claim 1, especially the series arcs, in an electrical network comprising at least one electrical equipment electrically connected to two power conductors, the electrical network being equipped with a common conductor, the detection method comprising the following steps:
   determining, by the first measuring member, at the level of a measurement area a first quantity ($V_{res}$) representative of the common mode voltage of the power conductors;
   determining, by the second measuring member, at the level of the measurement area a second quantity ($I_{net}$) representative of a network current flowing in the power conductors of the network;
   exploiting, by the calculator, the first quantity ($V_{res}$) and the second quantity ($I_{net}$) to detect the occurrence of a series arc in the electrical network.

17. The detection method according to claim 16 also comprising a step aimed at determining, over a determined observation period, a quantity representative of an energy referred to as "mixed energy" ($E_{mix}$) defined as the integral over the determined observation period of the product of the common mode voltage and of the network current, and transiting in the measurement area, the mixed energy being determined from the product of the first quantity ($V_{res}$) and of the second quantity ($I_{net}$).

18. The detection method according to claim 17 also comprising a step for processing the quantity representative of the mixed energy ($E_{mix}$) determined over distinct observation periods, in particular for determining the variation of this mixed energy.

19. The detection method according to claim 17 comprising the determination, over a determined observation period, of quantities representative of the mixed energies ($E_{mix}$) transiting in a plurality of measurement areas and the exploitation of the determined mixed energies ($E_{mix}$) in order to localize the occurrence of the series arc in the electrical network, in particular by calculating the mixed energy differences.

20. A method for deploying a system for detecting a fault, especially series arcs, in an electrical network comprising at least one first power conductor and a second power conductor, the method comprising the following steps:
   equipping the electrical network with a common conductor;
   electrically connecting at least one detection device according to claim 1 to the power conductors and to the common conductor.

* * * * *